US012575229B2

(12) United States Patent
Zeng et al.

(10) Patent No.: US 12,575,229 B2
(45) Date of Patent: Mar. 10, 2026

(54) LIGHT-EMITTING DIODE CHIP AND MANUFACTURING METHOD THEREOF

(71) Applicant: XIAMEN SAN'AN OPTOELECTRONICS CO., LTD., Xiamen City (CN)

(72) Inventors: Jiangbin Zeng, Xiamen City (CN); Anhe He, Xiamen City (CN); Kangwei Peng, Xiamen City (CN); Suhui Lin, Xiamen City (CN); Chung-ying Chang, Xiamen City (CN); Peng Liu, Xiamen City (CN); Yu Zhan, Xiamen City (CN); Chao Lu, Xiamen City (CN); Qing Wang, Xiamen City (CN); Lingyuan Hong, Xiamen City (CN)

(73) Assignee: XIAMEN SAN'AN OPTOELECTRONICS CO., LTD., Xiamen City (CN)

( * ) Notice: Subject to any disclaimer, the term of this patent is extended or adjusted under 35 U.S.C. 154(b) by 734 days.

(21) Appl. No.: 17/833,921

(22) Filed: Jun. 7, 2022

(65) Prior Publication Data

US 2022/0393072 A1     Dec. 8, 2022

(30) Foreign Application Priority Data

Jun. 7, 2021     (CN) .......................... 202110630631.1

(51) Int. Cl.
| | |
|---|---|
| *H10H 20/83* | (2025.01) |
| *H10H 20/831* | (2025.01) |
| *H10H 20/832* | (2025.01) |
| *H10H 20/01* | (2025.01) |
| *H10H 20/814* | (2025.01) |

(52) U.S. Cl.
CPC ...... *H10H 20/835* (2025.01); *H10H 20/8312* (2025.01); *H10H 20/01335* (2025.01); *H10H 20/032* (2025.01); *H10H 20/814* (2025.01)

(58) Field of Classification Search
CPC ... H10H 20/00–882; H10H 29/00–142; H10H 29/30–962; H10H 20/84; H10H 20/855; H10H 20/856; F21K 9/00–278; H01L 25/0753; H01L 24/75; H01L 24/98; H01L 2221/68322; H01L 2221/68354; H01L 2224/75822; H01L 2224/7598; H01L 2924/12041; H01L 21/6835; H01L 24/95; H01L 25/167; H01L 2224/0344

See application file for complete search history.

(56) References Cited

U.S. PATENT DOCUMENTS

| | | | |
|---|---|---|---|
| 2007/0228415 A1 | 10/2007 | Kanamura et al. | |
| 2011/0297914 A1* | 12/2011 | Zheng .................. | H10H 20/841 |
| | | | 257/13 |

(Continued)

FOREIGN PATENT DOCUMENTS

| | | |
|---|---|---|
| CN | 102664227 A | 9/2012 |
| CN | 105895772 A | 8/2016 |

(Continued)

*Primary Examiner* — Moin M Rahman

(57) ABSTRACT

The present disclosure provides a light-emitting diode chip, which includes a substrate, an epitaxial structure, an electrode metal layer, and a eutectic metal layer. The eutectic metal layer has an elongation greater than that of the electrode metal layer, and a hardness less than that of the electrode metal layer.

10 Claims, 3 Drawing Sheets

(56)          References Cited

U.S. PATENT DOCUMENTS

2015/0214440  A1*   7/2015  Chae ................... H10H 20/856
                                                    257/98
2018/0090639  A1*   3/2018  Ting .................. H10H 20/8314
2018/0097148  A1    4/2018  Hsu
2020/0365771  A1*  11/2020  Hiroki ................ H10H 20/835

FOREIGN PATENT DOCUMENTS

CN        106711316  A     5/2017
CN        109545814  A     3/2019
JP       2011204804  A    10/2011
TW        201436287  A     9/2014

* cited by examiner

LIGHT-EMITTING DIODE CHIP AND MANUFACTURING METHOD THEREOF

CROSS REFERENCE TO RELATED APPLICATIONS

This application claims the priority of Chinese Patent Application No. 202110630631.1, filed Jun. 7, 2021, the content of which is hereby incorporated by reference in its entirety.

TECHNICAL FIELD

The present disclosure relates to the field of optoelectronic technology, and particularly to a light-emitting diode chip and a manufacturing method thereof.

BACKGROUND

Light-emitting diode (LED) chips of a flip-chip structure are widely used in the field of optoelectronics because they have a good light emitting efficiency and good heat dissipation.

Nowadays, the flip-chip LED chips are mainly packaged by the following two methods. The first is the Au-stub bumping process, according to which, an Au-stub is placed on a package holder and then electrodes of the LED chip are aligned with the Au-stub. The second is the eutectic bonding process, according to which, after manufacturing the eutectic metal layer on the LED chip, the LED chip is first pre-attached to the package holder using low-temperature flux, and then reflowed at a temperature higher than the melting point of the eutectic metal layer to bond the LED chip to the package holder.

Due to the low cost and large productivity of the eutectic metal layer, and the lower requirement to alignment accuracy between the LED chip and the package holder compared to the Au-stub bumping process, the eutectic bonding process is mostly used for large-scale packaging of LED chips. However, the eutectic metal layer is usually formed on the surface of the flip chip, i.e., on the surface of the distributed Bragg reflector (DBR). As the Bragg reflector layer consists of multiple alternating low refractive index layers and high refractive index layers, the thickness of the Bragg reflector layer is generally large, for example, greater than 3 microns, so the eutectic metal layer is likely subject to large stress and stripped from the Bragg reflector layer when the LED chip is pulled or rubbed by external forces, resulting in dropping of the electrode from the LED chip.

SUMMARY

One aspect of the present disclosure provides a light-emitting diode chip, which includes a substrate, an epitaxial structure, an electrode metal layer, and a eutectic metal layer. The epitaxial structure is provided on the substrate, and includes a first semiconductor layer, a light-emitting layer and a second semiconductor layer which are laminated in a direction away from the substrate. The electrode metal layer is provided on the epitaxial structure, and includes a first electrode connected to the first semiconductor layer and a second electrode connected to the second semiconductor layer. The first electrode is insulated from the second electrode. The eutectic metal layer is provided on the electrode metal layer, and includes a first eutectic electrode connected to the first electrode and a second eutectic electrode connected to the second electrode. The first eutectic electrode is insulated from the second eutectic electrode. The eutectic metal layer has an elongation greater than that of the electrode metal layer, and a hardness less than that of electrode metal layer.

Another aspect of the present disclosure provides a method for manufacturing an LED chip. The method includes following steps:

providing a substrate;

growing an epitaxial structure on the substrate, the epitaxial structure including a first semiconductor layer, a light-emitting layer and a second semiconductor layer which are laminated in a direction away from the substrate;

forming an electrode metal layer on the epitaxial structure, the electrode metal layer including a first electrode connected to the first semiconductor layer and a second electrode connected to the second semiconductor layer, the first electrode being insulated from the second electrode; and forming a eutectic metal layer on the electrode metal layer, the eutectic metal layer including a first eutectic electrode connected to the first electrode and a second eutectic electrode connected to the second electrode, the first eutectic electrode being insulated from the second eutectic electrode, the eutectic metal layer having an elongation greater than that of the electrode metal layer, and a hardness less than that of the electrode metal layer.

The details of one or more embodiments of the present disclosure are set forth in the following drawings and description. Other features, objects and advantages of the present disclosure will become apparent from the description, drawings and claims.

BRIEF DESCRIPTION OF THE DRAWINGS

To more clearly describe the solutions of the embodiments of the disclosure, accompany drawings are provided, which are only related to some of the embodiments of the disclosure and are not intended to limit the disclosure and the protection scope of the present invention. Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

DETAILED DESCRIPTION

Figure 1:
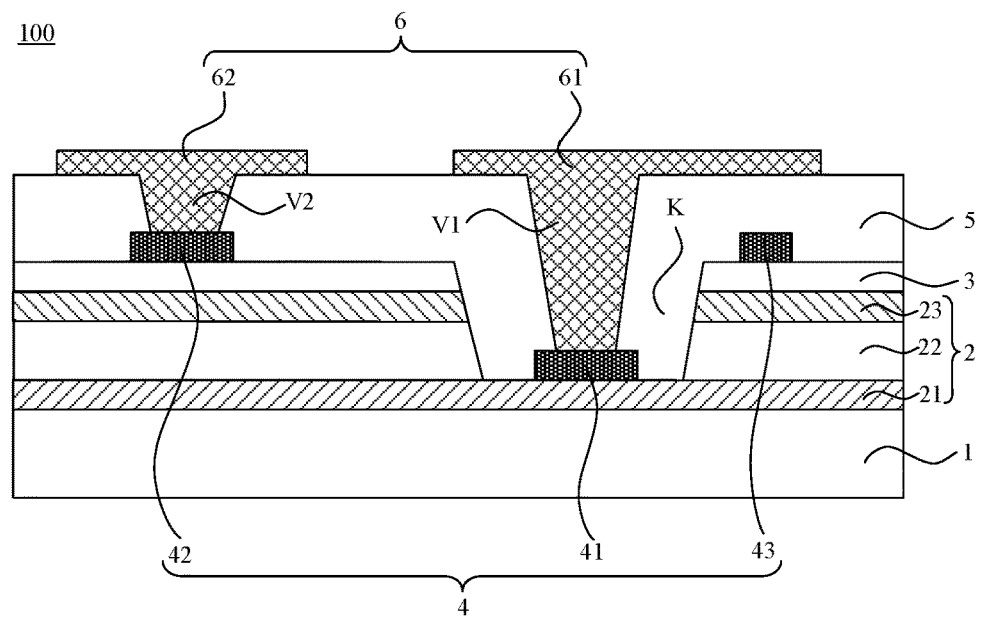
FIG. 1 is a schematic diagram of a cross-sectional structure of an LED chip according to an embodiment.

To facilitate understanding the present disclosure, the present disclosure will be described in details below with reference to the accompanying drawings. Embodiments of the present disclosure are shown in the accompanying drawings. However, the present disclosure can be implemented in many different forms and is not limited to the embodiments described herein. Rather, these embodiments are provided only for the purpose of making the disclosure of the present disclosure more thorough and comprehensive.

Unless otherwise defined, all technical and scientific terms used herein have the same meaning as commonly understood by those skilled in the art to which the present disclosure belongs. The terms used herein in the specification of the present disclosure are for the purpose of describing specific embodiments only and are not intended to limit the present disclosure.

It should be understood that when a component or layer is described to be "on . . . ", "adjacent to . . . ", "connected to . . . " or "coupled to . . . " other components or layers, it may be directly on, adjacent to, connected to, or coupled to the other components or layers, or there may be intermediate components or layers. Conversely, when components are described to be "directly on . . . ", "directly adjacent to", "directly connected to", or "directly coupled to" other components or layers, then there are no intermediate components or layers.

It should be understood that while the terms "first", "second", "third", etc. may be used to describe various elements, components, regions, layers and/or portions, such elements, components, regions, layers and/or portions should not be limited by such terms. These terms are used only to distinguish one element, component, region, layer or portion from another element, component, region, layer or portion. Thus, without departing from the teachings of this disclosure, the first element, component, region, layer, or portion discussed below may also be denoted as a second element, component, zone, layer, or portion.

Spatial relation terms such as "under . . . ", "below . . . ", "underneath", "above . . . ", "on top of . . . " etc., which can be used here to describe the relation between one element or feature and another element or feature shown in the figures. It should be understood that in addition to the orientations shown in the figures, the spatial relation terms also include the different orientations of the devices in use or operation. For example, if the device in the accompanying drawings is flipped, the element or feature described as "under" or "below" the another element will be oriented to be "on" the other element or features. Thus, the exemplary terms "under" or "below" may include both up and down orientations. In addition, devices may also include additional orientations (e.g., rotated 90 degrees or other orientations), and the spatial terms used herein should be interpreted accordingly.

As used herein, the singular forms "a", "an" and "said/the" may also include the plural forms, unless the context clearly indicates otherwise. It is also to be understood that the terms "includes/contains", "has" etc. indicate the presence of the stated feature, entirety, step, operation, component, portion or combination thereof, but do not preclude the presence or addition of one or more other features, entireties, steps, operations, components, portions or combinations thereof. Also, in this specification, the term "and/or" includes any combination of the listed items.

Referring to FIG. 1, some embodiments of the disclosure provide an LED chip 100 with a flip-chip structure that has a good light emitting efficiency and good heat dissipation. The LED chip 100 includes a substrate 1, an epitaxial structure 2, an electrode metal layer 4 and a eutectic metal layer 6.

As shown in FIG. 1, the epitaxial structure 2 is epitaxially grown on the substrate 1, and includes a first semiconductor layer 21, a light-emitting layer 22 and a second semiconductor layer 23 which are laminated in a direction away from the substrate 1.

The substrate 1 here may be a sapphire substrate, silicon carbide substrate, silicon substrate, gallium nitride substrate, aluminum nitride substrate, zinc oxide substrate, or other substrates, which are suitable for epitaxial growth. An exemplary substrate 1 is a sapphire substrate.

The light-emitting layer 22 here may be a quantum well. The first semiconductor layer 21 and the second semiconductor layer 23 are of different types. For example, the first semiconductor layer 21 is an N-type GaN layer and the second semiconductor layer 23 is a P-type GaN layer, vice versa, i.e., the first semiconductor layer 21 is a P-type GaN layer and the second semiconductor layer 23 is an N-type GaN layer. In the case where the N-type gallium nitride layer provides electrons and the P-type gallium nitride layer provides holes, the electrons and holes are able to diffuse into the quantum well under an external electric field, and transit and recombine with each other in the quantum well, thereby radiating energy outwardly by means of photons to emit light, i.e., enabling the light-emitting layer 22 to emit light.

Referring to FIG. 1 again, in some embodiments, the LED chip 100 also includes a current spreading layer 3 provided on a surface of the second semiconductor layer 23. The current spreading layer 3 is a transparent conductive layer, such as an indium tin oxide (ITO) layer, a zinc oxide (ZnO) layer, a cadmium tin oxide (CTO) layer, an indium oxide (InO) layer, an indium (In)-doped zinc oxide (ZnO) layer, an aluminum (Al)-doped zinc oxide (ZnO) layer, or gallium (Ga)-doped zinc oxide (ZnO) layer, etc. The current spreading layer 3 has a high electrical conductivity and a high visible light transmittance, which effectively improves the light emitting efficiency of the epitaxial structure 2.

As shown in FIG. 1, the electrode metal layer 4 is provided on the epitaxial structure 2. The electrode metal layer 4 includes a first electrode 41 connected to the first semiconductor layer 21 and a second electrode 42 connected to the second semiconductor layer 23. The first electrode 41 is insulated from the second electrode 42.

Considering the fact that the first semiconductor layer 21 is located at the bottom of the epitaxial structure 2, according to some embodiments of the disclosure, an opening may be provided in the epitaxial structure 2, allowing the first semiconductor layer 21 to be exposed to facilitate the connection of the first electrode 41 to the first semiconductor layer 21.

Similarly, as shown in FIG. 1, in the embodiment where the LED chip 100 including the current spreading layer 3, the current spreading layer 3, the second semiconductor layer 23 and the light-emitting layer 22 are provided with an opening K extending there through to a surface of the first semiconductor layer 21. The first electrode 41 is provided on a part of the surface of the first semiconductor layer 21 within the opening K, and is insulated from the light-emitting layer 22, the second semiconductor layer 23, and the current spreading layer 3. The second electrode 42 is provided on a surface of the current spreading layer 3, and is connected to the second semiconductor layer 23 through the current spreading layer 3.

The first electrode 41 and the second electrode 42 here are different patterns of the electrode metal layer 4, respectively, and both are obtained in the same process. Only the structure of the electrode metal layer 4 will be described in the following. In addition, the electrode metal layer 4 may include other patterns for other uses, such as an extended electrode 43 shown in FIG. 1, but is not limited to it.

As shown in FIG. 1, a eutectic metal layer 6 is provided on the electrode metal layer 4, and includes a first eutectic electrode 61 connected to the first electrode 41 and a second eutectic electrode 62 connected to the second electrode 42. The first eutectic electrode 61 is insulated from the second eutectic electrode 62.

The first eutectic electrode 61 and the second eutectic electrode 62 here are different patterns of the eutectic metal layer 6, respectively, and both are obtained in the same process. Only the structure of the eutectic metal layer 6 will be described in the following.

Referring to FIG. 1 again, in some embodiments, the LED chip 100 further includes an insulating layer 5 provided on a part of the surface of current spreading layer 3 that is not covered by the second electrode 42, a side wall of the opening K and an exposed part of the surface of the first semiconductor layer 21 that is not covered by the first electrode 41, and between the electrode metal layer 4 and the eutectic metal layer 6. The first eutectic electrode 61 is connected to the first electrode 41 through a first via V1 in the insulating layer 5, and the second eutectic electrode 62 is connected to the second electrode 42 through a second via V2 in the insulating layer 5.

The insulating layer 5 here may be of a single-layer structure or a multi-layer structure. The material of the insulating layer 5 may be one or more of silicon dioxide (SiO2), aluminum oxide (Al2O3), silicon nitride (SiNx), or titanium dioxide (TiO2).

Optionally, the insulating layer 5 is a Bragg reflector layer (DBR). That is, the insulating layer 5 consists of multiple alternating low refractive index layers and high refractive index layers. The low refractive index layer is, for example, a silicon dioxide (SiO2) layer and the high refractive index layer is, for example, a titanium dioxide (TiO2) layer, such that the light emitted from the epitaxial structure 2 can be effectively reflected so as to improve the light-emitting efficiency of the LED chip 100.

The above eutectic metal layer 6 is provided on the electrode metal layer 4 for the soldering and packaging of the LED chip 100 to the package holder. The eutectic metal layer 6 has an elongation greater than that of the electrode metal layer 4, and a hardness less than that of the electrode metal layer 4, such that the eutectic metal layer 6 has a good resistance to lateral deformation, thus ensuring that the flexibility of the eutectic metal layer 6 is better than that of the electrode metal layer 4.

The eutectic metal layer 6 is located at an outer surface of the LED chip 100, and the insulating layer 5 is located between the eutectic metal layer 6 and the electrode metal layer 4. The eutectic metal layer 6 has a good flexibility so that the flexibility of the LED chip 100 can be effectively improved. Since the flexibility of the eutectic metal layer 6 is better than that of the electrode metal layer 4, the eutectic metal layer 6 is prevented from being subject to a large stress when the LED chip 100 is pulled or rubbed by an external force, which thus reduces the risk of stripping of eutectic metal layer 6 from the insulating layer 5 and avoids dropping of the electrodes from the LED chip 100. Thus, the reliability of the LED chip 100 is improved.

The LED chip 100 adopts a flip-flop structure, in which, in addition to the insulating layer 5 that acts as a Bragg reflector layer (DBR), the electrode metal layer 4 and the eutectic metal layer 6 can each be provided with a reflective metal layer to further reflect the light emitted from epitaxial structure 2 while maintaining good electrical conductivity, so as to further improve the light-emitting efficiency of LED chip 100.

Figure 2:
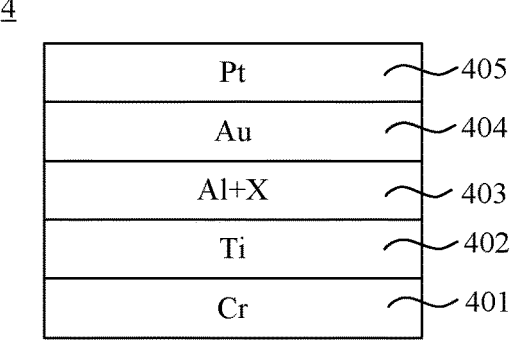
FIG. 2 is a schematic diagram of a cross-sectional structure of an electrode metal layer in the LED chip shown in FIG. 1.

With reference to FIG. 2, in some embodiments, the electrode metal layer 4 includes an aluminum alloy reflective layer 403. The presence of aluminum alloy reflective layer 403 in the electrode metal layer 4 ensures that the electrode metal layer 4 has a high light reflectivity while maintaining good electrical conductivity, according to embodiments.

Base on above, the electrode metal layer 4 may be a stack of multiple layers of metals, for example, the electrode metal layer 4 also includes an ohmic contact metal layer, a barrier metal layer, etc. As an example as shown in FIG. 2, the electrode metal layer 4 includes a chromium (Cr) metal layer 401, a titanium (Ti) metal layer 402, an aluminum alloy (Al+X) reflection layer 403, a gold (Au) metal layer 404, and a platinum (Pt) metal layer 405 which are laminated in a direction away from the substrate 1, but not limited thereto.

In addition, the types of alloying elements doped in the aluminum alloy reflective layer 403 and the mass percentage may be selected according to actual needs. For example, the alloying elements in the aluminum alloy reflective layer 403 include at least one of chromium (Cr), copper (Cu), magnesium (Mg), manganese (Mg), nickel (Ni), or zinc (Zn). For example, the percentage of alloying elements in the aluminum alloy reflective layer 403 is less than or equal to 15% by mass.

Figure 3:
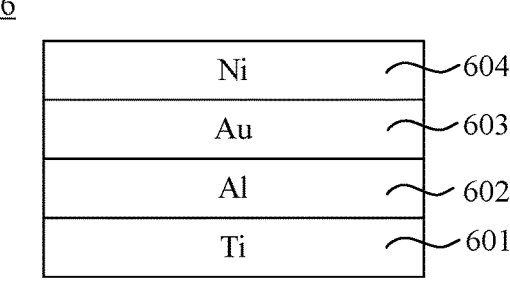
FIG. 3 is a schematic diagram of a cross-sectional structure of a eutectic metal layer in the LED chip shown in FIG. 1.

With reference to FIG. 3, in some embodiments, the eutectic metal layer 6 includes a pure aluminum reflective layer 602. The presence of the pure aluminum reflective layer 602 in the eutectic metal layer 6 ensures that the eutectic metal layer 6 also has a high light reflectivity while maintaining a good electrical conductivity, according to the embodiments.

In this case, the percentage of aluminum in the pure aluminum reflective layer 602 is greater than or equal to 99.0% by mass. Moreover, the percentage of each other trace element in the pure aluminum reflective layer 602 shall not exceed 0.10% by mass, except in special cases. The special cases include, but are not limited to, the trace elements including iron (Fe) and silicon (Si) with the total mass percentage of Fe and Si not exceeding 1.0%, and the trace elements including chromium (Cr), manganese (Mn) and copper (Cu) such that the mass percentage of Cu is allowed to be greater than 0.10% but must be less than or equal to 0.20%, provided that the mass percentage of each of Cr and Mn does not exceed 0.05%.

Based on above, the eutectic metal layer 6 may be a stack of multiple layers of metals. For example, the eutectic metal layer 6 also includes a barrier metal layer and a weld metal layer, etc. As an example as shown in FIG. 3, the eutectic metal layer 6 includes a titanium (Ti) metal layer 601, a pure aluminum (Al) reflective layer 602, a gold (Au) metal layer 603 and a nickel (Ni) metal layer 604, but is not limited thereto.

Since the electrode metal layer 4 is doped with other alloy metals, the aluminum alloy reflective layer 403 in the electrode metal layer 4 has dotted or flaky spots on its edges, while the pure aluminum reflective layer 602 in the eutectic metal layer 6 has smoother edges.

The structures of the electrode metal layer 4 and the eutectic metal layer 6 of the embodiments have been described above. The eutectic metal layer 6 is exposed at the outer surface of the LED chip 100 and may have a better heat dissipation than the electrode metal layer 4. Thus, the aluminum alloy reflective layer 403 that has a lower metal activity than pure aluminum is provided in the electrode metal layer 4, and the pure aluminum reflective layer 602 that has a higher metal activity than aluminum alloy is provided in the eutectic metal layer 6, which is helpful to balance the high-temperature activity of aluminum ions in the electrode metal layer 4 and the eutectic metal layer 6, reducing the electromigration of aluminum ions between the electrode metal layer 4 and the eutectic metal layer 6 due to high temperature and enhancing the electromigration resistance of the electrode metal layer 4. As such, after the LED chip 100 operates for a long time and becomes hot, the electromigration resistance of the electrode metal layer 4 can avoid the appearance of a large number of holes due to the migration of aluminum ions, thus reducing the risk of functional degradation or failure of the electrode metal layer 4 due to the presence of a large number of holes.

It is understood that the area of the orthogonal projection of the eutectic metal layer 6 on the substrate 1 is larger than the area of the orthogonal projection of the electrode metal layer 4 on the substrate 1. That is, the eutectic metal layer 6 has a larger exposed area. As such, the heat dissipating performance of the eutectic metal layer 6 can be further improved to further reduce the impact on the electrode metal layer 4 and the eutectic metal layer 6 due to the heat of the LED chip 100, especially the impact on electromigration of aluminum ions.

In addition, during the actual production of LED chips, from multiple test results of samples, the probability of abnormalities such as stripping of insulating layer and chip fracture in the LED chip 100 of the embodiments is reduced by 30%-40%, compared with related technologies, which effectively improves the flexibility and reliability of the LED chip 100.

Figure 4:
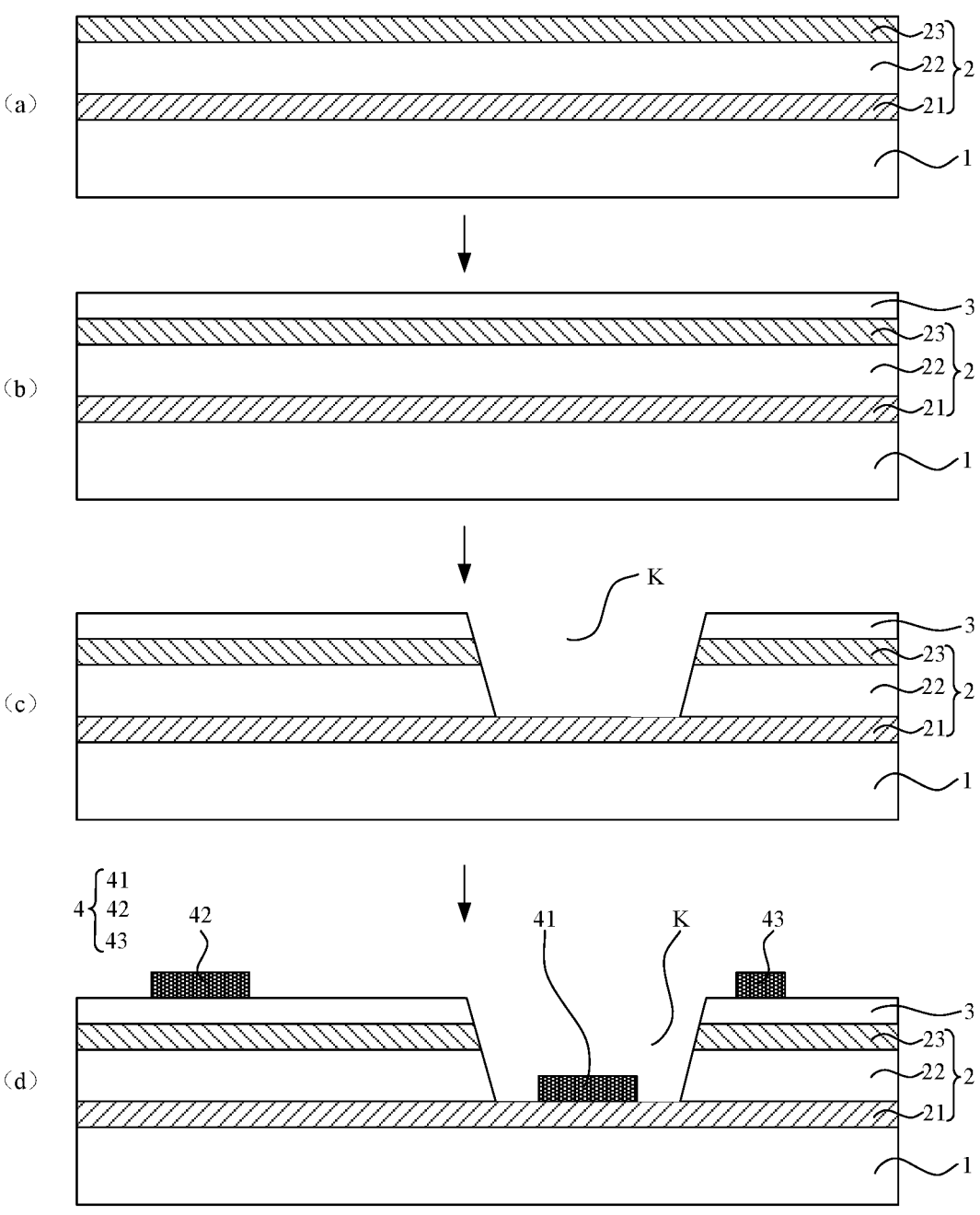
FIGS. 4-5 show cross-sectional views in sequential steps of a method for manufacturing an LED chip, according to an embodiment of the disclosure.
Figure 5:
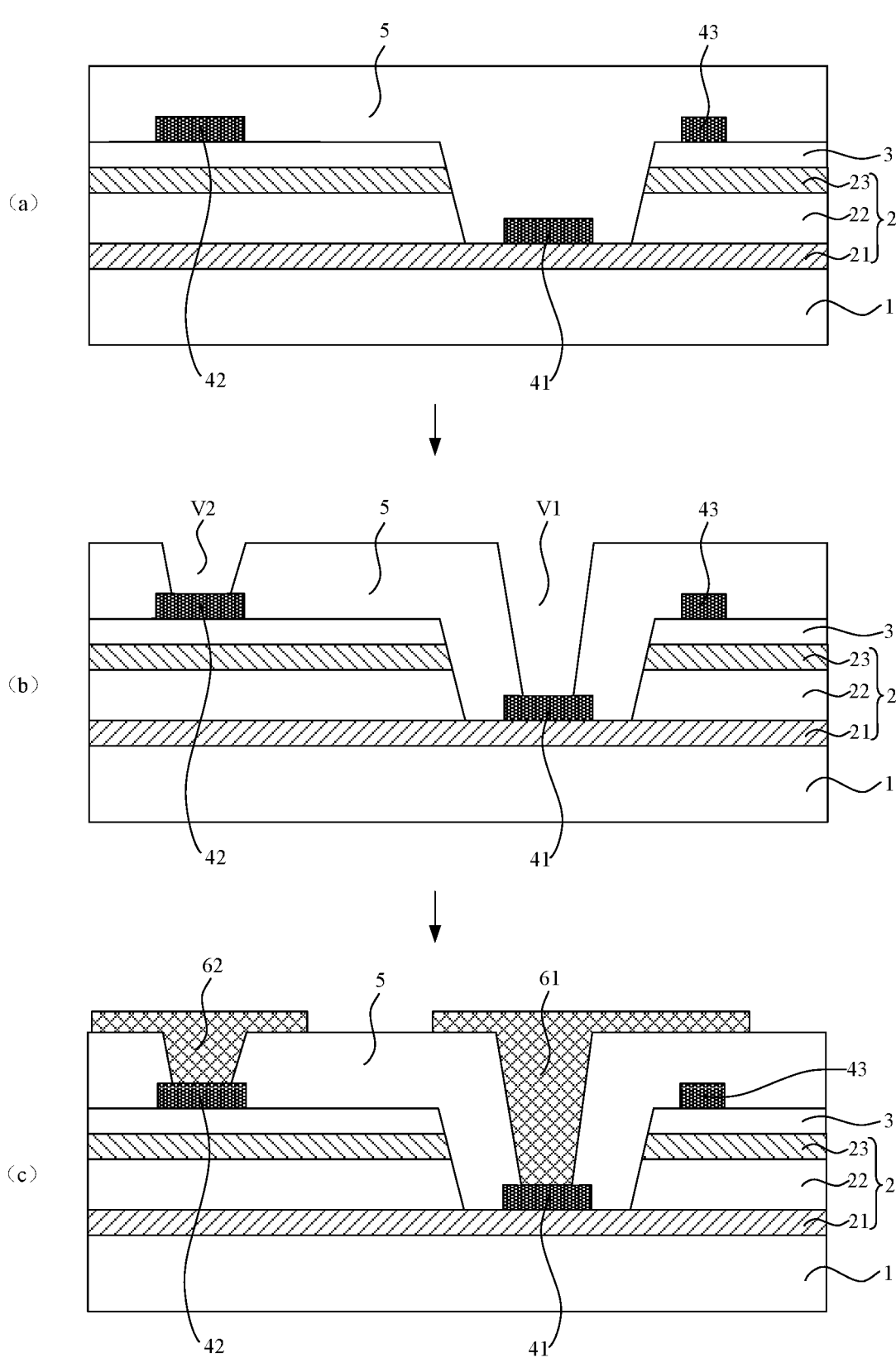

Some embodiments also provide a method of manufacturing an LED chip, for manufacturing the LED chip 100 as described in some of the above embodiments. With reference to FIG. 4-5, the method includes S100, S200 and S300. S100, as shown in part (a) of FIG. 4, a substrate 1 is provide, on which an epitaxial structure 2 is epitaxially grown.

Exemplarily, growing the epitaxial structure 2 on the substrate 1 includes growing, in sequence, a first semiconductor layer 21, a light-emitting layer 22, and a second semiconductor layer 23 on the substrate 1 in a direction away from the substrate 1.

The substrate 1 here is, for example, a sapphire substrate, a silicon carbide substrate, a silicon substrate, a gallium nitride substrate, an aluminum nitride substrate, or a zinc oxide substrate, etc. which are suitable for epitaxial growth. The light-emitting layer 22 is, for example, multiple quantum well. The first semiconductor layer 21 is, for example, an N-type GaN layer, and the second semiconductor layer 23 is, for example, a P-type GaN layer. Alternatively, the first semiconductor layer 21 is, for example, a P-type GaN layer, and the second semiconductor layer 23 is, for example, an N-type GaN layer.

In some embodiments, the method of manufacturing the LED chip 100 also includes S110.

S110, as shown in part (b) of FIG. 4, a current spreading layer 3 is formed on the epitaxial structure 2.

The current spreading layer 3 is formed on a surface of the second semiconductor layer 23. The current spreading layer 3 is, for example, an indium tin oxide (ITO) layer, a zinc oxide (ZnO) layer, a cadmium tin oxide (CTO) layer, an indium oxide (InO) layer, an indium (In)-doped zinc oxide (ZnO) layer, an aluminum (Al)-doped zinc oxide (ZnO) layer, or a gallium (Ga)-doped zinc oxide (ZnO) layer, etc.

For ease of description, the following embodiments are illustrated, assuming the LED chip 100 includes the current spreading layer 3.

S200, an electrode metal layer 4 is formed on the epitaxial structure 2. The electrode metal layer 4 includes a first electrode 41 connected to the first semiconductor layer 21 and a second electrode 42 connected to the second semiconductor layer 23. The first electrode 41 is insulated from the second electrode 42.

Based on the fact that the first semiconductor layer 21 is located at the bottom of the epitaxial structure 2, in some embodiments, S200 includes S210 and S220.

S210, as shown in part (c) of FIG. 4, an opening K that extends through the current spreading layer 3, the second semiconductor layer 23, and the light-emitting layer 22 to a surface of the first semiconductor layer 21 is formed to expose a part of the surface of the first semiconductor layer 21.

S220, as shown in part (d) of FIG. 4, a first electrode 41 is formed on a part of the surface of the first semiconductor layer 21 exposed within the opening K such that the first electrode 41 is in contact with the first semiconductor layer 21 and insulated from the light-emitting layer 22, the second semiconductor layer 23, and the current spreading layer 3. A second electrode 42 is formed on a surface of the current spreading layer 3 so that the second electrode 42 is connected to the second semiconductor layer 23 through the current spreading layer 3.

In addition, the electrode metal layer 4 can be obtained by electron beam evaporation. The first electrode 41 and the second electrode 42 are different patterns of the electrode metal layer 4, respectively. Further, the electrode metal layer 4 may include other patterns for other uses, such as an extended electrode 43 shown in (d) of FIG. 4, but is not limited to it.

S300, a eutectic metal layer 6 is formed on the electrode metal layer 4. The eutectic metal layer 6 includes a first eutectic electrode 61 connected to the first electrode 41 and a second eutectic electrode 62 connected to the second electrode 42. The first eutectic electrode 61 is insulated from the second eutectic electrode 62.

The eutectic metal layer 6 here may be obtained by electron beam evaporation. The first eutectic electrode 61 and the second eutectic electrode 62 are different patterns of the eutectic metal layer 6.

In addition, in some embodiments, the LED chip 100 also includes an insulating layer 5 provided on a part of the surface of current spreading layer 3 that is not covered by the second electrode 42, a side wall of the opening K and an exposed part of the surface of the first semiconductor layer 21 that is not covered by the first electrode 41, and provided between the electrode metal layer 4 and the eutectic metal layer 6. Accordingly, S300 includes S310-S330.

S310, as shown in part (a) in FIG. 5, the insulating layer 5 is provided on a part of the surface of current spreading layer 3 that is not covered by the second electrode 42, a side wall of the opening K, an exposed part of the surface of the first semiconductor layer 21 that is not covered by the first electrode 41 and the electrode metal layer 4.

The insulating layer 5 here may be obtained by a chemical vapor deposition process (Plasma Enhanced Chemical Vapor Deposition, or PECVD). The insulating layer 5 is of, for example, a single-layer structure or a multi-layer structure. The material of the insulating layer 5 may be one or more of silicon dioxide ($SiO_2$), aluminum oxide ($Al_2O_3$), silicon nitride ($SiN_x$), or titanium dioxide ($TiO_2$). Optionally, the insulating layer 5 is a Bragg reflector layer (DBR).

S320, as shown in part (b) of FIG. 5, a first via V1 and a second via V2 are formed in the insulating layer 5 by an etching process.

S330, as shown in part (c) in FIG. 5, a first eutectic electrode 61 and a second eutectic electrode 62 are formed in the insulating layer 5 such that the first eutectic electrode 61 is connected to the first electrode 41 through the first via V1 and the second eutectic electrode 62 is connected to the second electrode 42 through the second via V2.

It should be noted that the elongation of the eutectic metal layer obtained in the above embodiment is greater than the elongation of the electrode metal layer, and the hardness of the eutectic metal layer is less than the hardness of the electrode metal layer. As such, the eutectic metal layer 6 has a good resistance to lateral deformation, thus ensuring that the flexibility of the eutectic metal layer 6 is better than that of the electrode metal layer 4.

The eutectic metal layer 6 is located at the outer surface of the LED chip 100, the insulating layer 5 is located between the eutectic metal layer 6 and the electrode metal layer 4, and the eutectic metal layer 6 has a good flexibility, such that the flexibility of the LED chip 100 can be effectively improved. Thus, the flexibility of the eutectic metal layer 6 is better than that of the electrode metal layer 4, which prevents the eutectic metal layer 6 from being subject to a large stress when the LED chip 100 is pulled or rubbed by an external force, and thus reduces the risk of stripping of eutectic metal layer 6 from the insulating layer 5 and avoids dropping of the electrodes from the LED chip 100. Thus, the reliability of the LED chip 100 is improved.

The structures of the electrode metal layer 4 and the eutectic metal layer 6 has been described in the previous embodiments and will not be described in detail here.

With reference to FIG. 2, in some embodiments, forming the electrode metal layer 4 on the epitaxial structure 2 includes forming a metal stack including an aluminum alloy reflective layer 403 on epitaxial structure 2. As an example, a chromium (Cr) metal layer 401, titanium (Ti) metal layer 402, an aluminum alloy (Al+X) reflective layer 403, a gold (Au) metal layer 404 and a platinum (Pt) metal layer 405 are formed in sequence.

With reference to FIG. 3, in some embodiments, forming the eutectic metal layer 6 on the electrode metal layer 4 includes forming a metal stack including a pure aluminum reflective layer 602 on the electrode metal layer 4. As an example, a titanium (Ti) metal layer 601, a pure aluminum (Al) reflective layer 602, a gold (Au) metal layer 603, and a nickel (Ni) metal layer 604 are formed in sequence.

The eutectic metal layer 6 is exposed at the outer surface of the LED chip 100 and may have a better heat dissipation than the electrode metal layer 4. Thus, the aluminum alloy reflective layer 403 that has a lower metal activity than pure aluminum is provided in the electrode metal layer 4, and the pure aluminum reflective layer 602 that has a higher metal activity than aluminum alloy is provided in the eutectic metal layer 6, which is conducive to balancing the high-temperature activity of aluminum ions in the electrode metal layer 4 and the eutectic metal layer 6 to reduce the electro-migration of aluminum ions between the electrode metal layer 4 and the eutectic metal layer 6 due to high temperature and enhance the electromigration resistance of the electrode metal layer 4. As such, after the LED chip 100 works for a long time and becomes hot, the electromigration resistance of the electrode metal layer 4 can avoid the appearance of a large number of holes due to the migration of aluminum ions, thus reducing the risk of functional degradation or failure of the electrode metal layer 4 due to the presence of a large number of holes.

The manufacturing method of the LED chip provided in the embodiments is used to manufacture the LED chip 100 in some of the preceding embodiments. The technical effects achieved by the preceding LED chip 100 can also be achieved by the manufacturing method. The described technical features of the above-mentioned embodiments can be combined flexibly, and to be concise, not all possible combinations of the technical features of the above embodiments are described. However, as long as there is no conflict, these combinations should be considered to be included in the disclosure.

What has been described above are only several embodiments of the disclosure, and their descriptions are more specific and detailed, but they are not to be construed as a limitation of the scope of the patent application. It should be noted that, for a person of ordinary skill in the art, a number of variations and improvements can be made without departing from the concept of the disclosure, all of which shall fall within the protection scope of the disclosure. Therefore, the protection scope of the disclosure shall be subject to the appended claims.

What is claimed is:

1. A light-emitting diode chip, comprising:
   a substrate;
   an epitaxial structure provided on the substrate, the epitaxial structure comprising a first semiconductor layer, a light-emitting layer and a second semiconductor layer which are laminated in a direction away from the substrate;
   an electrode metal layer provided on the epitaxial structure, the electrode metal layer comprising a first electrode connected to the first semiconductor layer and a second electrode electrically connected to the second semiconductor layer, the first electrode being insulated from the second electrode; and
   a eutectic metal layer provided on the electrode metal layer, the eutectic metal layer comprising a first eutectic electrode connected to the first electrode and a second eutectic electrode connected to the second electrode, the first eutectic electrode being insulated from the second eutectic electrode,
   wherein the eutectic metal layer has an elongation greater than that of the electrode metal layer and a hardness less than that of the electrode metal layer, and the eutectic metal layer comprises a pure aluminum reflective layer.

2. The light-emitting diode chip of claim 1, wherein the electrode metal layer comprises an aluminum alloy reflective layer.

3. The light-emitting diode chip of claim 2, wherein a percentage of alloying elements in the aluminum alloy reflective layer is less than or equal to 15% by mass, and the alloying elements comprise at least one of chromium, copper, magnesium, manganese, nickel or zinc.

4. The light-emitting diode chip of claim 1, wherein an orthographic projection of the eutectic metal layer on the substrate is larger than an orthographic projection of the electrode metal layer on the substrate.

5. The light-emitting diode chip of claim 1, further comprising a current spreading layer provided on a surface of the second semiconductor layer, the current spreading layer, the second semiconductor layer and the light-emitting layer being commonly provided with an opening that extends therethrough to a surface of the first semiconductor layer, wherein the first electrode is provided on a part of the surface of the first semiconductor layer within the opening, and is insulated from the light-emitting layer, the second semiconductor layer and the current spreading layer, the second electrode being provided on a surface of the current spreading layer.

6. The light-emitting diode chip of claim 5, further comprising an insulating layer provided on a part of the surface of the current spreading layer that is not covered by the second electrode, a sidewall of the opening and an exposed part of the surface of the first semiconductor layer, and between the electrode metal layer and the eutectic metal layer, the first eutectic electrode being connected to the first electrode through a first via in the insulating layer, the second eutectic electrode being connected to the second electrode through a second via in the insulating layer.

7. The light-emitting diode chip of claim 6, wherein the insulating layer comprises a Bragg reflector layer.

8. A method for manufacturing a light-emitting diode chip, comprising:

providing a substrate;

growing an epitaxial structure on the substrate, the epitaxial structure comprising a first semiconductor layer, a light-emitting layer and a second semiconductor layer which are laminated in a direction away from the substrate;

forming an electrode metal layer on the epitaxial structure, the electrode metal layer comprising a first electrode connected to the first semiconductor layer and a second electrode electrically connected to the second semiconductor layer, the first electrode being insulated from the second electrode; and forming a eutectic metal layer on the electrode metal layer, the eutectic metal layer comprising a first eutectic electrode connected to the first electrode and a second eutectic electrode connected to the second electrode, the first eutectic electrode being insulated from the second eutectic electrode, wherein the eutectic metal layer has an elongation greater than that of the electrode metal layer and a hardness less than that of the electrode metal layer, and the eutectic metal layer comprises a pure aluminum reflective layer.

9. The method of claim 8, wherein the forming the electrode metal layer on the epitaxial structure comprises forming, on the epitaxial structure, a metal stack comprising an aluminum alloy reflective layer.

10. The method of claim 8, wherein the forming the eutectic metal layer on the electrode metal layer comprises forming, on the electrode metal layer, a metal stack comprising a pure aluminum reflective layer.

* * * * *